US010845554B2

(12) United States Patent
Konegawa et al.

(10) Patent No.: US 10,845,554 B2
(45) Date of Patent: Nov. 24, 2020

(54) OPTO-ELECTRIC HYBRID BOARD

(71) Applicant: NITTO DENKO CORPORATION, Ibaraki-shi (JP)

(72) Inventors: Naoto Konegawa, Ibaraki (JP); Yuichi Tsujita, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/346,937

(22) PCT Filed: Nov. 20, 2017

(86) PCT No.: PCT/JP2017/041609
§ 371 (c)(1),
(2) Date: May 2, 2019

(87) PCT Pub. No.: WO2018/101098
PCT Pub. Date: Jun. 7, 2018

(65) Prior Publication Data
US 2020/0057214 A1  Feb. 20, 2020

(30) Foreign Application Priority Data
Nov. 30, 2016 (JP) ................. 2016-232620

(51) Int. Cl.
G02B 6/42 (2006.01)
G02B 6/00 (2006.01)
(52) U.S. Cl.
CPC ........... *G02B 6/428* (2013.01); *G02B 6/4202* (2013.01)
(58) Field of Classification Search
CPC .................................. G02B 6/42; G02B 6/00
(Continued)

(56) References Cited

U.S. PATENT DOCUMENTS 5,198,655 A * 3/1993 Suetsugu ........... H04N 1/02835
250/208.1
5,375,184 A * 12/1994 Sullivan ................... G02B 6/10
385/129
(Continued)

FOREIGN PATENT DOCUMENTS

CN 103543492 A 1/2014
CN 105556441 A 5/2016
(Continued)

OTHER PUBLICATIONS

Notification of Transmittal of Translation of the International Preliminary Report on Patentability PCT/IB/338) issued in counterpart International Application No. PCT/JP20171041609 dated Jun. 13, 2019, with Forms PCT/IB/373 and PCT/ISA/237. (12 pages).
(Continued)

*Primary Examiner* — Kaveh C Kianni
(74) *Attorney, Agent, or Firm* — Westerman, Hattori, Daniels & Adrian, LLP

(57) ABSTRACT

Opto-electric hybrid boards are disclosed including an electric circuit board; light-emitting and light-receiving elements which are mounted on a first surface of the electric circuit board; and an optical waveguide having a core for an optical path and formed in a stacked manner on a second surface of the electric circuit board. The core of the optical waveguide includes: end portions formed as light reflecting surfaces for reflecting light to allow the light to propagate between the core and the light-emitting and light-receiving elements; extensions extending from the end portion side of the core toward the light-emitting and light-receiving elements; and a main portion from which the extensions extend. The extensions of the core and the main portion of the core are different from each other in shape of cross-sections perpendicular to an axial direction thereof.

6 Claims, 8 Drawing Sheets

(58) Field of Classification Search
USPC .......................................................... 384/14
See application file for complete search history.

(56) References Cited

U.S. PATENT DOCUMENTS

| | | | |
|---|---|---|---|
| 6,791,675 B2 | 9/2004 | Kikuchi et al. | |
| 6,975,792 B1* | 12/2005 | Goldberg | G02B 6/4202 |
| | | | 385/15 |
| 7,050,691 B2* | 5/2006 | Ishizaki | G02B 6/1221 |
| | | | 264/1.24 |
| 9,709,724 B1* | 7/2017 | Wegner | F21V 5/045 |
| 2002/0021879 A1 | 2/2002 | Lee et al. | |
| 2002/0064345 A1 | 5/2002 | Kikuchi et al. | |
| 2004/0047539 A1* | 3/2004 | Okubora | G02B 6/13 |
| | | | 385/14 |
| 2004/0218848 A1* | 11/2004 | Shen | G02B 6/43 |
| | | | 385/14 |
| 2006/0140546 A1* | 6/2006 | Nakata | G02B 6/136 |
| | | | 385/88 |
| 2007/0080458 A1 | 4/2007 | Ogawa et al. | |
| 2007/0183718 A1* | 8/2007 | Bae | G02B 6/12004 |
| | | | 385/47 |
| 2009/0297096 A1* | 12/2009 | Hodono | G02B 6/4214 |
| | | | 385/14 |
| 2009/0310904 A1 | 12/2009 | Matsubara et al. | |
| 2010/0061679 A1* | 3/2010 | Hayashi | G02B 6/138 |
| | | | 385/14 |
| 2010/0104246 A1* | 4/2010 | Hodono | G02B 6/4224 |
| | | | 385/88 |
| 2010/0129026 A1* | 5/2010 | Hodono | G02B 6/42 |
| | | | 385/14 |
| 2010/0129036 A1* | 5/2010 | Hodono | B32B 38/1841 |
| | | | 385/88 |
| 2010/0215314 A1* | 8/2010 | Lau | G02B 6/43 |
| | | | 385/14 |
| 2011/0007998 A1* | 1/2011 | Yamamoto | G02B 6/138 |
| | | | 385/14 |
| 2011/0052205 A1* | 3/2011 | Yu | H04B 10/801 |
| | | | 398/142 |
| 2012/0002915 A1* | 1/2012 | Shiraishi | G02B 6/4214 |
| | | | 385/14 |
| 2013/0230277 A1 | 9/2013 | Lee | |
| 2014/0016896 A1 | 1/2014 | Hanazono et al. | |
| 2014/0061441 A1* | 3/2014 | Shiraishi | H04B 10/69 |
| | | | 250/214 A |
| 2014/0105536 A1* | 4/2014 | Yasuda | G02B 6/428 |
| | | | 385/14 |
| 2016/0238416 A1 | 8/2016 | Shimizu et al. | |
| 2017/0329079 A1* | 11/2017 | Tsujita | H05K 1/0274 |

FOREIGN PATENT DOCUMENTS

| | | | |
|---|---|---|---|
| JP | 2001201670 A | * | 7/2001 |
| JP | 2002-169042 A | | 6/2002 |
| JP | 2004-503799 A | | 2/2004 |
| JP | 2006-38958 A | | 2/2006 |
| JP | 2006-270037 A | | 10/2006 |
| JP | 2010-107558 A | | 5/2010 |
| JP | 2010-140055 A | | 6/2010 |
| JP | 2014-29466 A | | 2/2014 |
| JP | 2014-74799 A | | 4/2014 |
| TW | 201338641 A | | 9/2013 |
| WO | 2007/114316 A1 | | 10/2007 |
| WO | 2015/056474 A1 | | 4/2015 |
| WO | 2016/093036 A1 | | 6/2016 |

OTHER PUBLICATIONS

International Search Report dated Jan. 30, 2018, issued in counterpart International Application No. PCT/JP2017/041609 (2 pages).
Office Action dated Apr. 14, 2020, issued in counterpart CN Application No. 201780072578.X, with English Translation. (13 pages).
Office Action dated Sep. 1, 2020, issued in counterpart JP application No. 2016-232620, with English translation. (9 pages).

* cited by examiner

US 10,845,554 B2

OPTO-ELECTRIC HYBRID BOARD

TECHNICAL FIELD

The present disclosure relates to an opto-electric hybrid board including an electric circuit board, an optical element mounted on this electric circuit board, and an optical waveguide formed in a stacked manner on the electric circuit board.

BACKGROUND ART

With the increase in the amount of transmission information, optical interconnect lines in addition to electrical interconnect lines have been used in recent electronic devices and the like. As an example, an opto-electric hybrid board (first conventional art) to be described below has been proposed. This opto-electric hybrid board includes: an electric circuit board including electrical interconnect lines formed on a front surface (a first surface) of an insulative layer; an optical waveguide [including a first cladding layer, a core (an optical interconnect line), and a second cladding layer] stacked on a back surface [a second surface, i.e. a surface on the side opposite from the surface (the first surface) with the electrical interconnect lines formed thereon] of the insulative layer of the electric circuit board; and a light-emitting element and a light-receiving element which are mounted on portions of the surface with the electrical interconnect lines formed thereon, the portions being corresponding to opposite end portions of the optical waveguide. In this opto-electric hybrid board, the opposite end portions of the optical waveguide are formed into inclined surfaces inclined at 45 degrees with respect to a longitudinal direction (a direction in which light propagates) of the core. Portions of the core which are positioned at the inclined surfaces function as light reflecting surfaces. The insulative layer is permeable to light to allow light to propagate therethrough between the light-emitting element and the light reflecting surface provided in a first end portion and between the light-receiving element and the light reflecting surface provided in a second end portion (an end portion on the side opposite from the first end portion).

The propagation of light in the aforementioned opto-electric hybrid board is performed in a manner to be described below. First, light is emitted from the light-emitting element toward the light reflecting surface in the first end portion. The light passes through the insulative layer, and then passes through the first cladding layer in a first end portion of the optical waveguide. Then, the light is reflected from the light reflecting surface in a first end portion of the core (or the optical path is changed by 90 degrees), and travels through the interior of the core in the longitudinal direction thereof. Then, the light propagated in the core is reflected from the light reflecting surface in a second end portion of the core (or the optical path is changed by 90 degrees), and travels toward the light-receiving element. Subsequently, the light passes through and exits from the first cladding layer in the second end portion. Then, the light passes through the insulative layer, and is received by the light-receiving element.

Unfortunately, the light emitted from the light-emitting element and the light reflected from the light reflecting surface in the second end portion are diffused. For this reason, the light-emitting element typically includes a light-emitting portion having a small light-emitting surface whereas the light-receiving element includes a light-receiving portion having a wide light-receiving surface. However, the light propagated effectively is still small in quantity. This results in high propagation losses of the light.

To reduce the propagation losses of light, there has been proposed an opto-electric hybrid board (second conventional art) in which a core in an optical waveguide extends from end portion sides of the core corresponding to the light reflecting surfaces toward the light-emitting element and the light-receiving element, so that the distance between a front end surface of one extension of the core and a light-emitting portion of the light-emitting element and the distance between a front end surface of the other extension of the core and a light-receiving portion of the light-receiving element are shortened (see PTL 1, for example). In this opto-electric hybrid board, the shortened distance from the light-emitting portion of the light-emitting element to the front end surface of the one extension allows the light emitted from the light-emitting surface of the light-emitting portion of the light-emitting element to enter the front end surface of the one extension of the core before the light diffuses too much. Similarly, the shortened distance from the front end surface of the other extension to the light-receiving portion of the light-receiving element allows the light-receiving surface of the light-receiving portion of the light-receiving element to receive the light before the light exiting the front end portion of the other extension of the core diffuses too much. Thus, the opto-electric hybrid board reduces the propagation losses of the light.

RELATED ART DOCUMENT

Patent Document

PTL 1: JP-A-2010-140055

SUMMARY

However, a further reduction in propagation losses of light has been required in recent times. The opto-electric hybrid board disclosed in PTL 1 still has room for improvement in these regards.

In view of the foregoing, it is therefore an object of the present disclosure to provide an opto-electric hybrid board capable of further reducing the propagation losses of light.

An opto-electric hybrid board according to the present disclosure comprises: an electric circuit board; an optical element mounted on a first surface of the electric circuit board; and an optical waveguide having a core for an optical path and formed in a stacked manner on a second surface on the opposite side of the electric circuit board from the first surface, wherein the core of the optical waveguide includes an end portion formed as a light reflecting surface for reflecting light to allow the light to propagate between the core and the optical element, an extension extending from the end portion side of the core toward the optical element, and a main portion from which the extension extends, and wherein the extension of the core and the main portion of the core are different from each other in shape of cross-sections perpendicular to an axial direction thereof.

In the present disclosure, objects similar or analogous in the aforementioned shape of the cross-sections are different in cross-sectional dimension and hence are treated as having different cross-sectional shapes.

The present inventors have made studies to further reduce the propagation losses of light in the opto-electric hybrid board in which the extension of the core is formed. In the course of the studies, the present inventors have hit upon the idea of causing the extension of the core and the main portion of the core from which the extension extends to be different from each other in shape of cross-sections perpendicular to an axial direction thereof. In conventional techniques, the extension of the core has been formed to have the same dimension as the main portion of the core from which the extension extends because importance is given to the reduction in distance between the front end surface of the extension of the core and the optical element, so that the aforementioned idea of causing the extension of the core and the main portion of the core to be different from each other in shape of cross-sections has not been reached. For this reason, the extension of the core and the main portion of the core from which the extension extends have been formed to have the same cross-sectional shape in the conventional techniques.

Causing the extension of the core and the main portion of the core from which the extension extends to be different from each other in shape of cross-sections as according to the aforementioned idea of the present inventors increases the flexibility of the shape of the extension of the core. Thus, the present inventors have found that the shape of the extension of the core can be formed so as to further reduce the propagation losses of light in accordance with the type of optical element and the structure or the like of the opto-electric hybrid board.

For example, when the optical element is a light-emitting element, light emitted from a light-emitting portion of the light-emitting element is diffused. The formation of a wide front end surface of the extension which receives the light allows a larger amount of light to enter the front end surface, thereby further reducing the propagation losses of the light. When the optical element is a light-receiving element, light exiting the front end surface of the extension on the light-receiving element side is diffused. The formation of a small front end surface of the extension which emits the light allows a light-receiving surface of a light-receiving portion of the light-receiving element to receive light with the extent of spread of the light further decreased, thereby further reducing the propagation losses of the light.

The opto-electric hybrid board according to the present disclosure, in which the extension extending from the end portion side of the core toward the optical element is formed, shortens the distance between the front end surface of the extension of the core and the optical element. This allows light to propagate before the light diffuses too much between the front end surface of the extension of the core and the optical element. As a result, the amount of effectively propagating light is increased, so that the propagation losses of the light are reduced. Further, in the opto-electric hybrid board according to the present disclosure, the extension of the core and the main portion of the core from which the extension extends are different from each other in shape of cross-sections perpendicular to the axial direction thereof. This increases the flexibility of the shape of the extension of the core. Thus, the shape of the extension of the core is formed so as to further reduce the propagation losses of the light in accordance with the type of optical element and the structure or the like of the opto-electric hybrid board.

For example, when the extension is an extension on the light-emitting element side, the formation of a wide front end surface of the extension allows a larger amount of light to enter the front end surface, thereby further reducing the propagation losses of the light. Also, when the extension is an extension on the light-receiving element side, the formation of a small front end surface of the extension allows the light-receiving surface of the light-receiving portion of the light-receiving element to receive light with the extent of spread of the light further decreased, thereby further reducing the propagation losses of the light.

In particular, in the case where the electric circuit board includes an insulative layer permeable to light, and an electrical interconnect line formed on a first surface of the insulative layer, where the insulative layer has a second surface on the side opposite from the first surface thereof, and the second surface of the insulative layer is the second surface of the electric circuit board on which the optical waveguide is formed in a stacked manner, and where the extension of the core has a front end surface in abutment with the second surface of the insulative layer, the front end surface of the extension is protected physically and chemically by the insulative layer. This allows the condition of the front end surface of the extension to be properly maintained, thereby maintaining a further reduction in propagation losses of the light.

In the case where the optical element is a light-emitting element including a light-emitting portion having a light-emitting surface, and where the front end surface of the extension of the core has an area greater than that of the light-emitting surface of the light-emitting portion of the light-emitting element, the wide front end surface (light entrance surface) of the extension allows a larger amount of light to enter the front end surface of the extension even if the light emitted from the light-emitting surface of the light-emitting portion of the light-emitting element is diffused. As a result, the propagation losses of the light are further reduced.

In the case where the optical element is a light-receiving element including a light-receiving portion having a light-receiving surface, and where the front end surface of the extension of the core has an area smaller than that of the light-receiving surface of the light-receiving portion of the light-receiving element, the small front end surface (light exit surface) of the extension allows the light-receiving surface of the light-receiving portion of the light-receiving element to receive the light, with the extent of spread of the light further decreased, even if the light exiting the front end surface of the extension is diffused. As a result, the propagation losses of the light are further reduced.

Further, in the case where the extension of the core has a side peripheral surface in contact with a cladding layer of the optical waveguide, and where an interface portion of the extension of the core with the cladding layer is in the form of a mixed layer in which a material for the formation of the cladding layer is mixed with a material for the formation of the core, the formation of the mixed layer prevents opposite surfaces of the mixed layer from becoming rough surfaces, although there are cases in which the interface portion of the extension of the core with the cladding layer becomes a rough surface in the absence of the mixed layer. The light traveling in the extension is not reflected from the interface (rough surface) but is reflected from part of the opposite surfaces of the mixed layer which faces the inside of the core. This achieves proper reflection of the light. As a result, this maintains the propagation efficiency of the light to maintain a further reduction in propagation losses of the light.

In the case where the extension of the core is tapered gradually toward the front end surface of the extension, the side peripheral surface of the extension is an inclined surface, so that the light is properly guided by the reflection of the light from the inclined surface. For example, when the extension is the extension on the light-emitting element side, the light entering the extension by way of the front end surface of the extension is efficiently guided to the light reflecting surface in the core end portion by the reflection of the light from the inclined surface. Thus, the propagation losses of the light are further reduced. When the extension is the extension on the light-receiving element side, the light reflected from the light reflecting surface in the core end portion is efficiently guided to the front end surface of the extension by the reflection of the light from the inclined surface. Thus, the propagation losses of the light are further reduced.

Also, in the case where an end portion of the light reflecting surface on the optical element side is positioned in the area of the extension of the core, the light reflected from the light reflecting surface in the extension on the light-emitting element side is efficiently guided to the front end surface of the extension. This further reduces the propagation losses of the light.

DESCRIPTION OF EMBODIMENTS

Next, embodiments according to the present disclosure will now be described in detail with reference to the drawings.

Figure 1:
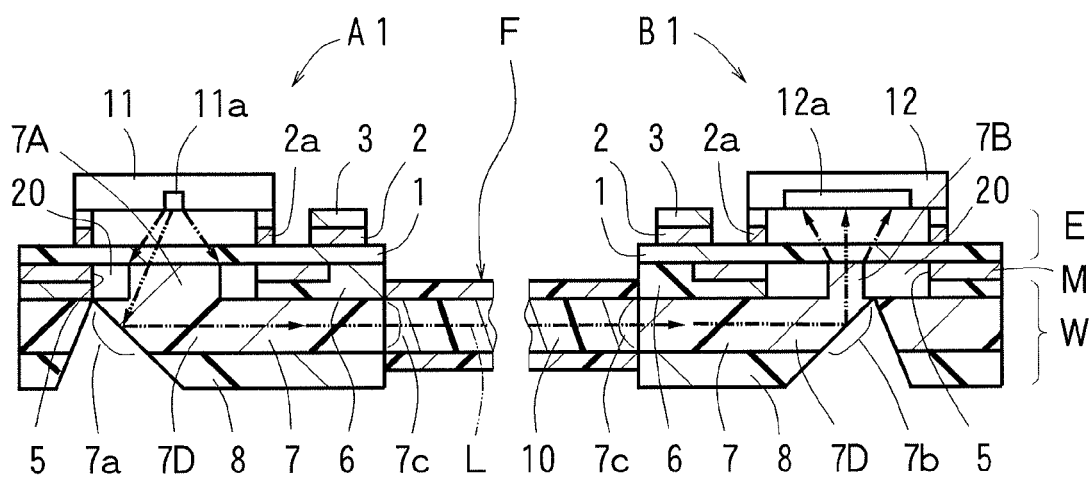
FIG. 1 is a schematic vertical sectional view of an opto-electric hybrid module including a first embodiment of opto-electric hybrid boards according to the present disclosure.

FIG. 1 is a vertical sectional view of an opto-electric hybrid module including a first embodiment of opto-electric hybrid boards according to the present disclosure. As shown in FIG. 1, opto-electric hybrid boards A1 and B1 according to this embodiment are used while being connected to opposite end portions of an optical fiber F. The opto-electric hybrid boards A1 and B1 and the optical fiber F form an opto-electric hybrid module. The opto-electric hybrid boards A1 and B1 in opposite end portions include: an electric circuit board E; optical elements 11 and 12 mounted on a first surface (an upper surface as seen in FIG. 1) of the electric circuit board E; and an optical waveguide W formed in a stacked manner on a second surface (a lower surface as seen in FIG. 1) on the opposite side of the electric circuit board E from the first surface. The optical elements 11 is a light-emitting element 11 provided in the opto-electric hybrid board A1 in a first end portion (a left-hand end portion as seen in FIG. 1), and the optical element 12 is a light-receiving element 12 provided in the opto-electric hybrid board B1 in a second end portion (a right-hand end portion as seen in FIG. 1). In this embodiment, a metal layer M for reinforcement is further provided in portions which lie between the electric circuit board E and the optical waveguide W and which correspond to mounting pads 2a on which the light-emitting element 11 and the light-receiving element 12 are mounted.

More specifically, the electric circuit board E includes: a light-permeable insulative layer 1; an electrical interconnect line 2 and the mounting pads 2a which are formed on a first surface (an upper surface as seen in FIG. 1) of the insulative layer 1; and a coverlay 3 covering the electrical interconnect line 2.

The optical waveguide W includes a core 7 for an optical path. The core 7 includes: a main portion 7D held between a first cladding layer 6 and a second cladding layer 8; and extensions 7A and 7B in the shape of quadrangular prisms extending from a first end portion side of the main portion 7D of the core 7 toward the light-emitting element 11 and the light-receiving element 12. First end portions of the optical waveguide W which correspond to the light-emitting element 11 and the light-receiving element 12 are formed into inclined surfaces inclined at 45 degrees with respect to a longitudinal direction of the main portion 7D of the core 7. Portions of the main portion 7D of the core 7 which are positioned at the inclined surfaces function as light reflecting surfaces 7a and 7b. Second end portions [end portions on the side opposite from the light reflecting surfaces 7a and 7b (first end portions)] of the optical waveguide W are formed into perpendicular surfaces perpendicular to a longitudinal direction of the core 7. Portions of the core 7 which are positioned at the perpendicular surfaces function as connection surfaces 7c for connection to end surfaces of a core 10 of the optical fiber F.

The main portion 7D and the extensions 7A and 7B of the core 7 except portions (end portions) where the light reflecting surfaces 7a and 7b are formed have square cross sections perpendicular to an axial direction thereof in this embodiment. However, the cross sections (square) are different in dimension (length of one side) (i.e. different in cross-sectional shape) between the main portion 7D and the extensions 7A and 7B. Further, the cross-sectional area of the extension 7A on the light-emitting element 11 side (in the opto-electric hybrid board A1) is greater than that of the extension 7B on the light-receiving element 12 side (in the opto-electric hybrid board B1). The area of a front end surface of the extension 7A on the light-emitting element 11 side (in the opto-electric hybrid board A1) is greater than that of a light-emitting surface of a light-emitting portion 11a of the light-emitting element 11. The area of a front end surface of the extension 7B on the light-receiving element 12 side (in the opto-electric hybrid board B1) is smaller than that of a light-receiving surface of a light-receiving portion 12a of the light-receiving element 12. In this case, it is preferable in the opto-electric hybrid board A1 on the light-emitting element 11 side that the entire light-emitting surface of the light-emitting portion 11a of the light-emitting element 11 is positioned as seen in plan view within the area of the front end surface of the extension 7A on the light-emitting element 11 side from the viewpoint of further reducing the propagation losses of light L. Similarly, it is preferable in the opto-electric hybrid board B1 on the light-receiving element 12 side that the entire front end surface of the extension 7B on the light-receiving element 12 side is positioned as seen in plan view within the area of the light-receiving surface of the light-receiving portion 12a of the light-receiving element 12. The light-emitting surface of the light-emitting portion 11a of the light-emitting element 11 is typically in the shape of a circle having a diameter of approximately 15 μm, and the light-receiving surface of the light-receiving portion 12a of the light-receiving element 12 is typically in the shape of a circle having a diameter on the order of 35 to 45 μm.

The front end surfaces of the extensions 7A and 7B of the core 7 in this embodiment are in abutment with a second surface (a lower surface as seen in FIG. 1) of the insulative layer 1 of the electric circuit board E. Further, hollow portions 20 filled with air are formed around respective side peripheral surfaces of the extensions 7A and 7B in this embodiment. The extensions 7A and 7B and the hollow portions 20 are hermetically sealed by the insulative layer 1i, the metal layer M, the first cladding layer 6, and the main portion 7D of the core 7.

The metal layer M is disposed between the insulative layer 1 of the electric circuit board E and the first cladding layer 6 of the optical waveguide W. Through holes 5 are formed in portions of the metal layer M which correspond to locations lying between the light-emitting element 11 and the light reflecting surface 7a and between the light-receiving element 12 and the light reflecting surface 7b.

The propagation of light in the aforementioned opto-electric hybrid module is performed in a manner to be described below. First, in the opto-electric hybrid board A in the first end portion (the left-hand end portion as seen in FIG. 1), light L is emitted from the light-emitting surface of the light-emitting portion 11a of the light-emitting element 11 toward the front end surface of the extension 7A of the core 7. The light L is transmitted through the insulative layer 1, and then enters the extension 7A by way of the front end surface of the extension 7A. Subsequently, the light L is reflected from the light reflecting surface 7a in the first end portion of the main portion 7D of the core 7, so that the optical path of the light L is changed by 90 degrees. Then, the light L is propagated in the main portion 7D of the core 7 to one of the connection surfaces 7c in the second end portion, and thereafter exits the one connection surface 7c. Subsequently, the light L enters the core 10 of the optical fiber F by way of a first end portion (a left-hand end portion as seen in FIG. 1) of the core 10 of the optical fiber F. Then, the light L is propagated in the core 10 of the optical fiber F to a second end portion (a right-hand end portion as seen in FIG. 1) of the core 10, and thereafter exits the second end portion thereof. Subsequently, in the opto-electric hybrid board B1 in the second end portion (the right-hand end portion as seen in FIG. 1), the light L enters the main portion 7D of the core 7 by way of the other connection surface 7c in a second end portion of the core 7. Subsequently, the light L is propagated to the light reflecting surface 7b in the first end portion of the main portion 7D of the core 7, and is reflected from the light reflecting surface 7b, so that the optical path of the light L is changed by 90 degrees. Then, the light L is propagated to the extension 7B of the core 7. Subsequently, the light L exits the front end surface of the extension 7B, and is transmitted through the insulative layer 1. Then, the light L is received by the light-receiving surface of the light-receiving portion 12a of the light-receiving element 12.

For the aforementioned light propagation in the opto-electric hybrid board A1 in the first end portion (the left-hand end portion as seen in FIG. 1), the distance between the front end surface of the extension 7A and the light-emitting portion 11a of the light-emitting element 11 is shortened because of the formation of the extension 7A extending from a first end portion side of the core 7 toward the light-emitting element 11. This allows the light L emitted from the light-emitting surface of the light-emitting portion 11a of the light-emitting element 11 to enter the front end surface of the extension 7A before the light L diffuses too much. As a result, the amount of effectively entering light L is increased, so that the propagation losses of the light L are reduced. Further, the area of the front end surface (a light entrance surface) of the extension 7A on the light-emitting element 11 side (in the opto-electric hybrid board A1) is greater than that of the light-emitting surface of the light-emitting portion 11a of the light-emitting element 11. This allows a larger amount of light L to enter the front end surface (the light entrance surface) of the extension 7A even if the light L emitted from the light-emitting portion 11a of the light-emitting element 11 is diffused. As a result, the propagation losses of the light L are further reduced.

In the opto-electric hybrid board B1 in the second end portion (the right-hand end portion as seen in FIG. 1), the distance between the front end surface of the extension 7B and the light-receiving portion 12a of the light-receiving element 12 is shortened because of the formation of the extension 7B extending from the first end portion side of the core 7 toward the light-receiving element 12. This allows the light-receiving surface of the light-receiving portion 12a of the light-receiving element 12 to receive the light L exiting the front end surface of the extension 7B before the light L diffuses too much. As a result, the amount of effectively received light L is increased, so that the propagation losses of the light L are reduced. Further, the area of the front end surface (a light exit surface) of the extension 7B on the light-receiving element 12 side (in the opto-electric hybrid board B1) is smaller than that of the light-receiving surface of the light-receiving portion 12a of the light-receiving element 12. This allows the light-receiving surface of the light-receiving portion 12a of the light-receiving element 12 to receive the light L, with the extent of spread of the light L further decreased, even if the light L exiting the front end surface (the light exit surface) of the extension 7B is diffused. As a result, the propagation losses of the light L are further reduced.

The side peripheral surfaces of the extensions 7A and 7B of the core 7 are in contact with air (the hollow portions 20). The extensions 7A and 7B have a refractive index exceeding 1, and the air has a refractive index of 1. Because of this refractive index difference, the light L propagated in the extensions 7A and 7B is not transmitted through the side peripheral surfaces of the extensions 7A and 7B but is reflected from the side peripheral surfaces. Thus, the light L does not leak from the extensions 7A and 7B.

Also, air is present outside the light reflecting surfaces 7a and 7b. Because of a difference in refractive index between the main portion 7D of the core 7 and the air, the light L is not transmitted through the light reflecting surfaces 7a and 7b but is reflected from the light reflecting surfaces 7a and 7b.

In the opto-electric hybrid boards A1 and B1, the extensions 7A and 7B and the hollow portions 20 are hermetically sealed by the insulative layer 1, the metal layer M, the first cladding layer 6, and the main portion 7D of the core 7. Thus, the extensions 7A and 7B are protected physically and chemically. In particular, the front end surfaces of the extensions 7A and 7B are in abutment with the second surface (the lower surface as seen in FIG. 1) of the insulative layer 1. Thus, the front end surfaces of the extensions 7A and 7B are also protected physically and chemically by the insulative layer 1. This allows the condition of the front end surfaces of the extensions 7A and 7B to be properly maintained, thereby maintaining a further reduction in propagation losses of the light L.

Next, a method of manufacturing the opto-electric hybrid boards A1 and B1 will be described. Only the opto-electric hybrid board B1 in which the light-receiving element 12 is mounted is shown in FIGS. 2A to 2D, 3A to 3D, 4A, and 4B which illustrate the manufacturing method because the same manufacturing method is used for the manufacture of the opto-electric hybrid boards A1 and B1.

[Formation of Electric Circuit Board E of Opto-Electric Hybrid Boards A1 and B1]

First, a metal sheet material Ma (with reference to FIG. 2A) for the formation of the metal layer M is prepared. Examples of a material for the formation of the metal sheet material Ma include stainless steel and 42 Alloy (an alloy of iron and nickel, wherein a content of the nickel is 42%). In particular, stainless steel is preferable from the viewpoint of dimensional accuracy and the like. The metal sheet material Ma (the metal layer M) has a thickness in the range of 10 to 100 μm, for example.

Figure 2A:
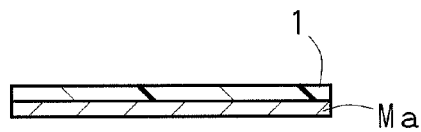
FIGS. 2A to 2C are illustrations schematically showing the steps of forming an electrical circuit board in the opto-electric hybrid boards.

Next, as shown in FIG. 2A, a photosensitive insulating resin is applied to a first surface (an upper surface as seen in FIG. 2A) of the metal sheet material Ma to form the insulative layer 1 having a predetermined pattern by a photolithographic process. Examples of a material for the formation of the insulative layer 1 include: synthetic resins such as polyimide, polyether nitrile, polyether sulfone, polyethylene terephthalate, polyethylene naphthalate, and polyvinyl chloride; and silicone-base sol-gel materials. The insulative layer 1 has a thickness in the range of 10 to 100 μm, for example.

Figure 2B:
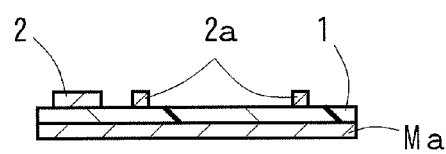

Next, as shown in FIG. 2B, the electrical interconnect line 2 and the mounting pads 2a are formed by a semi-additive process or a subtractive process, for example.

Figure 2C:
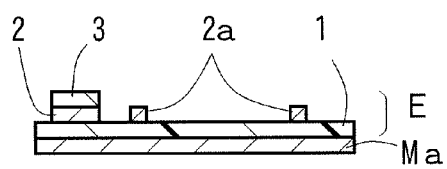

Next, as shown in FIG. 2C, a photosensitive insulating resin including a polyimide resin or the like is applied to a portion of the electrical interconnect line 2 to thereby form the coverlay 3 by a photolithographic process. In this manner, the electric circuit board E is formed on the first surface of the metal sheet material Ma.

[Formation of Metal Layer M of Opto-Electric Hybrid Boards A1 and B1]

Figure 2D:
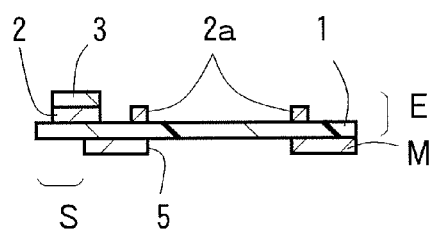
FIG. 2D is an illustration schematically showing the step of forming a metal layer in the opto-electric hybrid boards.

Thereafter, as shown in FIG. 2D, etching or the like is performed on the metal sheet material Ma to remove a portion [a portion corresponding to the second end portion of the optical waveguide W (with reference to FIG. 1)] S on a longitudinally front end portion side of the metal sheet material Ma and to form the through hole 5 in the metal sheet material Ma. In this manner, the metal sheet material Ma is formed into the metal layer M.

[Formation of Optical Waveguide W of Opto-Electric Hybrid Boards A1 and B1]

Figure 3A:
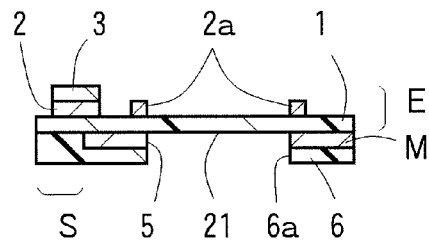
FIGS. 3A to 3D are illustrations schematically showing the steps of forming an optical waveguide in the opto-electric hybrid boards.

For the formation of the optical waveguide W (with reference to FIG. 1) on a back surface (a surface corresponding to the second surface of the electric circuit board E) of a laminate comprised of the electric circuit board E and the metal layer M, a photosensitive resin which is a material for the formation of the first cladding layer 6 is initially applied to the back surface (the lower surface as seen in the figure) of the laminate to form the first cladding layer 6 by a photolithographic process, as shown in FIG. 3A. The first cladding layer 6 thus formed fills the site where the portion S on the longitudinally front end portion side of the metal layer M is removed but does not fill the through hole 5 of the metal layer M. Thus, a recessed portion 21 is defined by the through hole 5, a portion (a through hole 6a) of the first cladding layer 6 which corresponds to the through hole 5, and a portion of the insulative layer 1 which corresponds to the through hole 5. The first cladding layer 6 has a thickness [a thickness as measured from a back surface (a lower surface as seen in the figure) of the metal layer M] in the range of 5 to 80 μm, for example. It should be noted that the back surface of the laminate is positioned to face upward when the optical waveguide W is formed (when the aforementioned first cladding layer 6, the core 7 to be described later, and the second cladding layer 8 to be described later are formed).

Figure 3B:
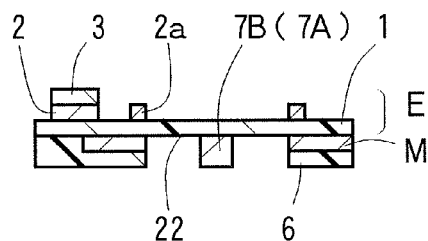

Next, as shown in FIG. 3B, a photosensitive resin which is a material for the formation of the extensions 7A and 7B of the core 7 is charged into the recessed portion 21 to form the extensions 7A and 7B of the core 7 by a photolithographic process. At this time, an annular recess 22 is defined between the side peripheral surfaces of the extensions 7A and 7B and the peripheral wall of the recessed portion 21. The extensions 7A and 7B have a length in the range of 20 to 300 μm, for example.

Figure 3C:
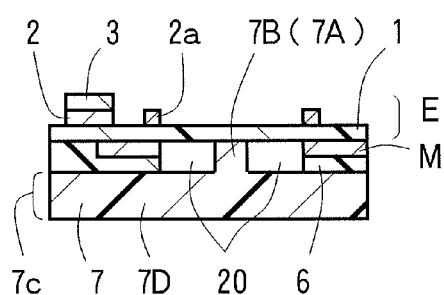

Next, as shown in FIG. 3C, a photosensitive dry film which is a material for the formation of the main portion 7D of the core 7 is stacked on a front surface (a lower surface as seen in the figure) of the first cladding layer 6 or a photosensitive resin is applied to the front surface of the first cladding layer 6 to form the main portion 7D of the core 7 by a photolithographic process. This closes the opening surface of the annular recess 22, so that the recess 22 becomes the aforementioned hollow portion 20. A front end portion (a second end portion) of the main portion 7D of the core 7 is formed into a surface perpendicular to the longitudinal direction of the core 7, and serves as the connection surface 7c for connection to an end surface of the core 10 (with reference to FIG. 1) of the optical fiber F. The main portion 7D of the core 7 has the following dimensions: a width in the range of 20 to 100 μm, a thickness in the range of 20 to 100 μm, and a length of 0.5 to 100 cm, for example. The extensions 7A and 7B of the core 7 have the same refractive index as the main portion 7D. The refractive index of the extensions 7A and 7B and the main portion 7D is higher than the refractive indices of the aforementioned first cladding layer 6 and the second cladding layer 8 to be described below (with reference to FIG. 3D).

Figure 3D:
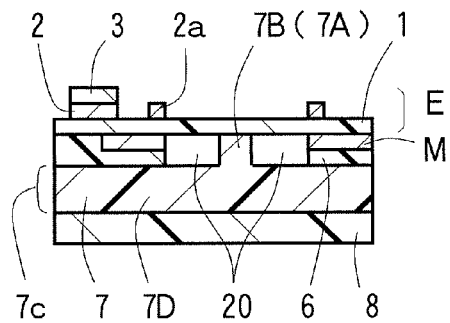

Then, as shown in FIG. 3D, a material for the formation of the second cladding layer 8 is applied to the front surface (the lower surface as seen in the figure) of the first cladding layer 6 so as to cover the main portion 7D of the core 7 to form the second cladding layer 8 by a photolithographic process. The second cladding layer 8 has a thickness [a thickness as measured from the top surface (the lower surface as seen in the figure) of the core 7] in the range of 3 to 50 μm. An example of the material for the formation of the second cladding layer 8 includes a photosensitive resin similar to that for the first cladding layer 6.

Figure 4A:
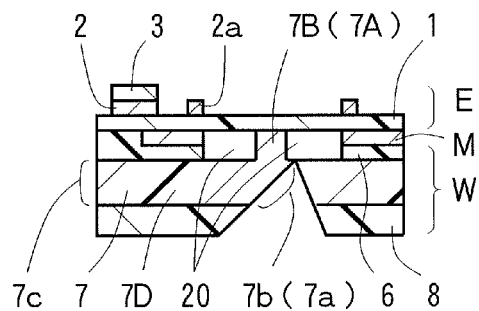
FIG. 4A is an illustration schematically showing the step of forming the optical waveguide.

Thereafter, as shown in FIG. 4A, a portion (the first end portion) of the main portion 7D of the core 7 which corresponds to each of the extensions 7A and 7B of the core 7 (which is positioned thereunder as seen in the figure) together with the first cladding layer 6 and the second cladding layer 8 is formed into an inclined surface inclined at 45 degrees with respect to the longitudinal direction of the main portion 7D of the core 7, for example, by laser machining. A portion of the main portion 7D of the core 7 which is positioned at the inclined surface serves as each of the light reflecting surfaces 7a and 7b. In this manner, the optical waveguide W is formed on the back surface (the lower surface as seen in the figure) of the laminate comprised of the electric circuit board E and the metal layer M.

[Mounting of Light-Emitting Element 11 and Light-Receiving Element 12 of Opto-Electric Hybrid Boards A1 and B1]

Figure 4B:
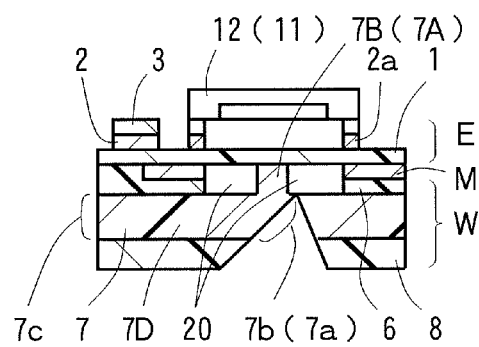
FIG. 4B is an illustration schematically showing the step of mounting optical elements in the opto-electric hybrid boards.

Then, as shown in FIG. 4B, the light-emitting element 11 and the light-receiving element 12 are mounted on the mounting pads 2a of the electric circuit board E. In this manner, the opto-electric hybrid board A1 including the light-emitting element 11 and the opto-electric hybrid board B1 including the light-receiving element 12 are provided.

Thereafter, the connection surface 7c of the core 7 of the opto-electric hybrid board A1 including the light-emitting element 11 is connected to the first end portion of the core 10 (with reference to FIG. 1) of the optical fiber F through a connector (not shown) or the like, and the connection surface 7c of the core 7 of the opto-electric hybrid board B1 including the light-receiving element 12 is connected to the second end portion (the end portion on the side opposite from the first end portion) of the core 10 of the optical fiber F through a connector (not shown) or the like. Thus, the opto-electric hybrid module shown in FIG. 1 is provided.

Figure 5:
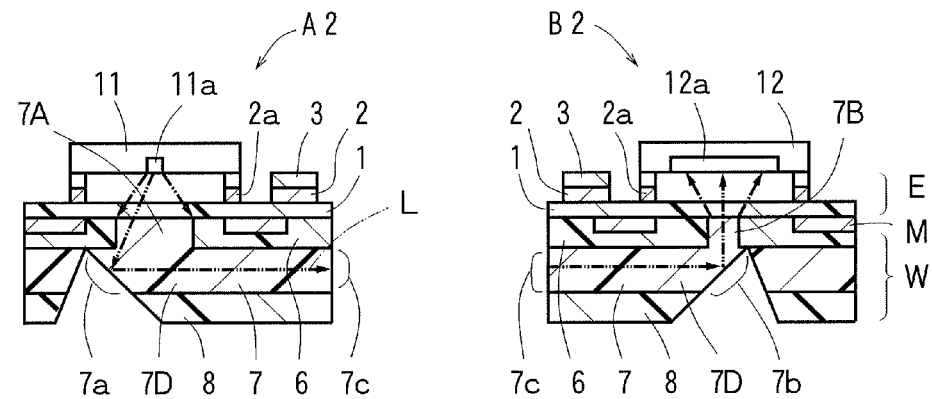
FIG. 5 is a schematic vertical sectional view of a second embodiment of the opto-electric hybrid boards according to the present disclosure.

FIG. 5 is a vertical sectional view of a second embodiment of the opto-electric hybrid boards according to the present disclosure. Opto-electric hybrid boards A2 and B2 according to this embodiment are configured such that the first cladding layer 6 in the first embodiment shown in FIG. 1 is formed in the hollow portions 20 (with reference to FIG. 1) around the side peripheral portions of the extensions 7A and 7B of the core 7. That is, the side peripheral portions of the extensions 7A and 7B of the core 7 are in contact with the first cladding layer 6. The remaining parts are similar to those of the aforementioned first embodiment, and like reference numerals and characters are used to designate similar parts.

Figure 6A:
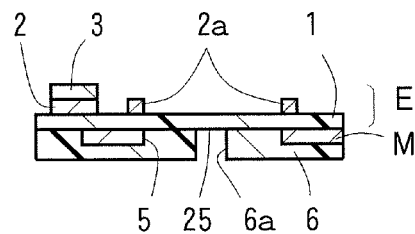
FIGS. 6A and 6B are illustrations schematically showing part of the steps of forming the optical waveguide in the opto-electric hybrid boards.
Figure 6B:
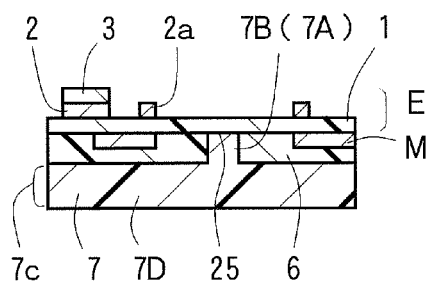

The production of the opto-electric hybrid boards A2 and B2 of the second embodiment until the step of forming the electric circuit board E and the step of forming the metal layer M is similar to that of the first embodiment (with reference to FIGS. 2A to 2D). In the subsequent step of forming the first cladding layer 6, the first cladding layer 6 is formed so that the through hole 5 formed in the metal sheet material Ma is filled with the first cladding layer 6 while the portion (the through hole 6a) corresponding to each of the extensions 7A and 7B (with reference to FIG. 5) of the core 7 is left unfilled, as shown in FIG. 6A. This provides a recessed portion 25 defined by the through hole 6a and a portion of the insulative layer 1 which corresponds to the through hole 6a. Subsequently, as shown in FIG. 6B, the photosensitive resin which is the material for the formation of the extensions 7A and 7B and the main portion 7D of the core 7 is applied to the front surface (the lower surface as seen in the figure) of the first cladding layer 6 and is charged into the recessed portion 25 to form the extensions 7A and 7B and the main portion 7D of the core 7 at the same time by a photolithographic process. The step of forming the second cladding layer 8 and the subsequent steps of the second embodiment are similar to those of the first embodiment (with reference to FIGS. 3D, 4A, and 4B).

The second embodiment also produces functions and effects similar to those of the first embodiment. In the second embodiment, the side peripheral surfaces of the extensions 7A and 7B of the core 7 are in contact with the first cladding layer 6, rather than the hollow portions 20 (with reference to FIG. 1). Thus, the extensions 7A and 7B are reinforced with the first cladding layer 6.

Figure 7:
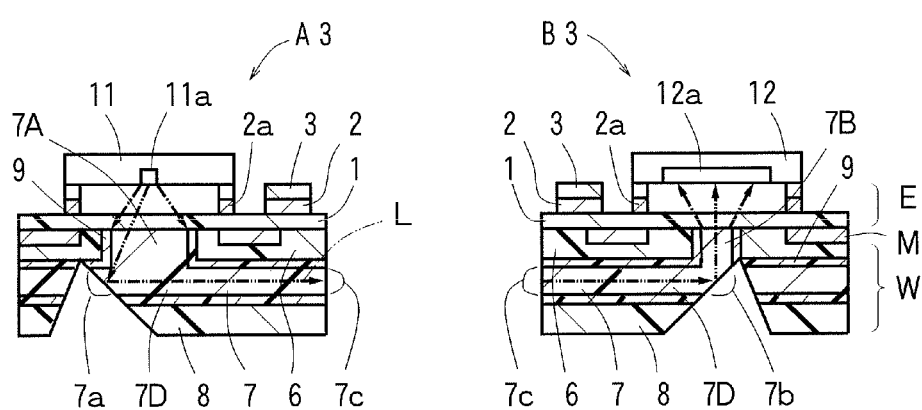
FIG. 7 is a schematic vertical sectional view of a third embodiment of the opto-electric hybrid boards according to the present disclosure.

FIG. 7 is a vertical sectional view of a third embodiment of the opto-electric hybrid boards according to the present disclosure. Opto-electric hybrid boards A3 and B3 according to this embodiment are configured such that an interface portion of the extensions 7A and 7B and the main portion 7D of the core 7 with the first cladding layer 6 in the second embodiment shown in FIG. 5 is in the form of a mixed layer 9 in which the material for the formation of the first cladding layer 6 is mixed with the material for the formation of the extensions 7A and 7B and the main portion 7D of the core 7. Also, an interface portion of the main portion 7D of the core 7 with the second cladding layer 8 is in the form of a mixed layer 9 in which the material for the formation of the second cladding layer 8 is mixed with the material for the formation of the core 7. The mixed layers 9 have a refractive index lower than that of the extensions 7A and 7B and the main portion 7D of the core 7, and is higher than the refractive indices of the first cladding layer 6 and the second cladding layer 8. The remaining parts are similar to those of the aforementioned second embodiment, and like reference numerals and characters are used to designate similar parts.

The production of the opto-electric hybrid boards A3 and B3 of the third embodiment until the step of forming the electric circuit board E and the step of forming the metal layer M is similar to that of the first embodiment (with reference to FIGS. 2A to 2D). The first cladding layer 6, the extensions 7A and 7B and the main portion 7D of the core 7, and the second cladding layer 8 are not completely cured but are put in a softened state in the subsequent steps of forming the first cladding layer 6 (with reference to FIG. 6A), forming the extensions 7A and 7B and the main portion 7D of the core 7 (with reference to FIG. 6B), and forming the second cladding layer 8 (with reference to FIG. 3D). Thereafter, the application of heat causes the materials for the formation of the first cladding layer 6 and the second cladding layer 8 to penetrate into the extensions 7A and 7B and the main portion 7D of the core 7, thereby forming the mixed layers 9. The thickness of the mixed layers 9 tends to increase as the core 7 and the like are in a more softened state, and tends to decrease as the heating temperature increases. The step of forming the light reflecting surfaces 7a and 7b and the subsequent steps of the third embodiment are similar to those of the first embodiment (with reference to FIGS. 4A and 4B).

The third embodiment also produces functions and effects similar to those of the second embodiment. In the third embodiment, the interface portions of the extensions 7A and 7B and the main portion 7D of the core 7 with the first cladding layer 6 and the second cladding layer 8 are in the form of the mixed layers 9. If the mixed layers 9 are not formed, there are cases in which the interface portions become rough surfaces. However, the formation of the mixed layers 9 prevents opposite surfaces of the mixed layers 9 from becoming rough surfaces. Thus, the light L traveling in the extensions 7A and 7B and the main portion 7D of the core 7 is not reflected from the interfaces (rough surfaces) but is reflected from part of the opposite surfaces of the mixed layers 9 which faces the inside of the core 7. This achieves proper reflection of the light L. As a result, this maintains the propagation efficiency of the light L to maintain a further reduction in propagation losses of the light L.

It is preferable that the percentage of the mixed layers 9 with respect to the width of the extensions 7A and 7B and the main portion 7D of the core 7 and the percentage of the mixed layers 9 with respect to the thickness of the extensions 7A and 7B and the main portion 7D of the core 7 are in the range of 5 to 20%. If the percentages are too low, the effects of the proper reflection of the light L from the mixed layers 9 tend to be produced insufficiently. If the percentages are too high, the area of the optical path in the extensions 7A and 7B and the main portion 7D of the core 7 decreases, so that the propagation losses of the light L tend to increase.

Figure 8:
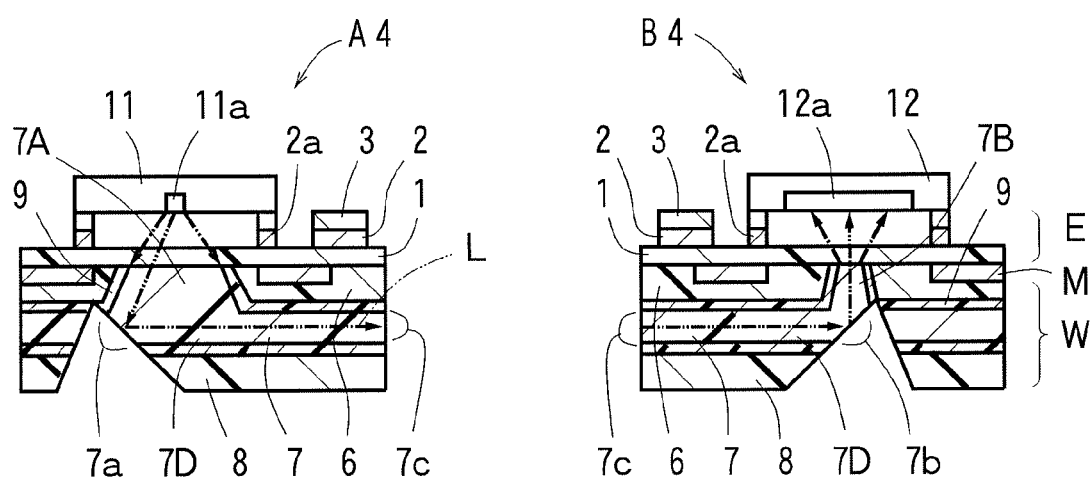
FIG. 8 is a schematic vertical sectional view of a fourth embodiment of the opto-electric hybrid boards according to the present disclosure.

FIG. 8 is a vertical sectional view of a fourth embodiment of the opto-electric hybrid boards according to the present disclosure. Opto-electric hybrid boards A4 and B4 according to this embodiment are configured such that the extensions 7A and 7B of the core 7 in the third embodiment shown in FIG. 7 are in the shape of truncated quadrangular pyramids which are tapered gradually toward the front end surfaces of the extensions 7A and 7B. The remaining parts are similar to those of the aforementioned third embodiment, and like reference numerals and characters are used to designate similar parts.

Figure 9:
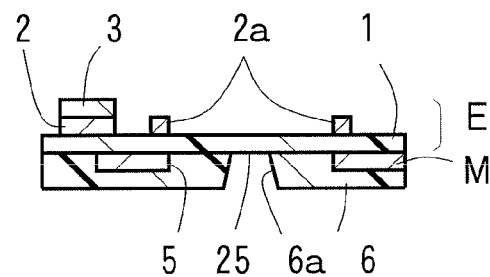
FIG. 9 is an illustration schematically showing part of the steps of forming the optical waveguide in the opto-electric hybrid boards.

The production of the opto-electric hybrid boards A4 and B4 of the fourth embodiment until the step of forming the electric circuit board E and the step of forming the metal layer M is similar to that of the first embodiment (with reference to FIGS. 2A to 2D). In the subsequent step of forming the first cladding layer 6, the first cladding layer 6 is formed by gradation exposure so that the portion (the through hole 6a) corresponding to each of the extensions 7A and 7B (with reference to FIG. 8) of the core 7 is tapered gradually toward the front end surface thereof, as shown in FIG. 9. In this process, the first cladding layer 6 is not completely cured but is put in a softened state. The step of forming the extensions 7A and 7B and the main portion 7D of the core 7 and the subsequent steps of the fourth embodiment are similar to those of the third embodiment (with reference to FIGS. 6B, 3D, 4A, and 4B).

The fourth embodiment also produces functions and effects similar to those of the third embodiment. In particular, the front end surface (the light exit surface) of the extension 7B on the light-receiving element 12 side is made smaller. This allows the light-receiving surface of the light-receiving portion 12a of the light-receiving element 12 to receive the light L, with the extent of spread of the light L further decreased. As a result, the propagation losses of the light L are further reduced.

In the fourth embodiment, the side peripheral surfaces of the extensions 7A and 7B are inclined surfaces, so that the light L is properly guided by the reflection of the light L from the inclined surfaces. For example, in the extension 7A on the light-emitting element 11 side, the light L entering the extension 7A by way of the front end surface of the extension 7A is efficiently guided to the light reflecting surface 7a by the reflection of the light L from the inclined surface. Thus, the propagation losses of the light L are further reduced. In the extension 7B on the light-receiving element 12 side, the light L reflected from the light reflecting surface 7b is efficiently guided to the front end surface of the extension 7B by the reflection of the light L from the inclined surface. Thus, the propagation losses of the light L are further reduced.

Although the interface portions of the extensions 7A and 7B and the main portion 7D of the core 7 with the first cladding layer 6 and the second cladding layer 8 are in the form of the mixed layers 9 in the fourth embodiment shown in FIG. 8, opto-electric hybrid boards (not shown) which do not include the mixed layers 9 may be provided according to an additional embodiment.

Figure 10:
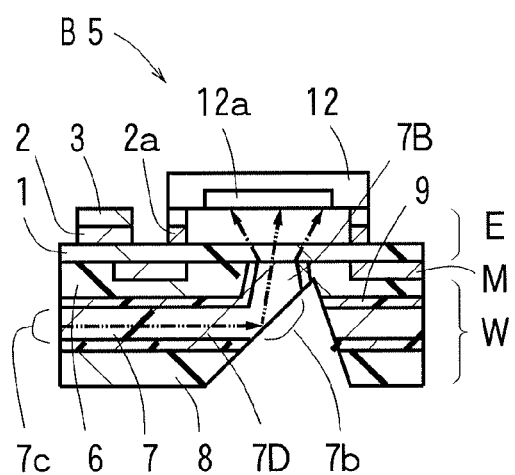
FIG. 10 is a schematic vertical sectional view of a fifth embodiment of an opto-electric hybrid board according to the present disclosure.

FIG. 10 is a vertical sectional view of a fifth embodiment of the opto-electric hybrid boards according to the present disclosure. This embodiment provides an opto-electric hybrid board B5 on the side where the light-receiving element 12 is mounted. This opto-electric hybrid board B5 is configured such that an end portion of the light reflecting surface 7b on the light-receiving element 12 side (an upper end portion of the light reflecting surface 7b as seen in FIG. 10) in the fourth embodiment shown in FIG. 8 is positioned in the area of the extension 7B of the core 7. The remaining parts are similar to those of the aforementioned fourth embodiment, and like reference numerals and characters are used to designate similar parts.

Figure 11A:
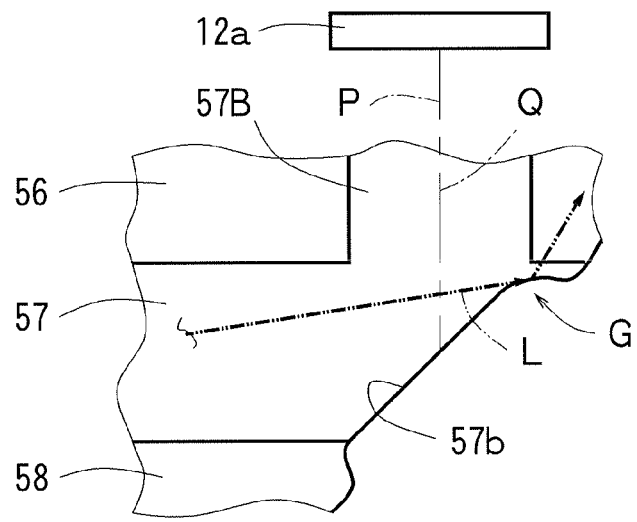
FIG. 11A is a schematic enlarged sectional view of a laser-machined light reflecting surface in an optical waveguide of a conventional opto-electric hybrid board.

Specifically, in the opto-electric hybrid board according to the aforementioned second conventional art, the upper end portion of a light reflecting surface 57b is positioned in a core 57 (corresponding to the main portion 7D of the core 7 of the fifth embodiment) and is not positioned in an extension 57B, as shown in FIG. 11A which is an enlarged view of principal parts. The reason is as follows. In the opto-electric hybrid board according to the second conventional art, a central axis Q (indicated by a dash-dot line in FIG. 11A) of the extension 57B is caused to coincide with a line P (indicated by a dash-dot line in FIG. 11A) connecting the center of the light reflecting surface 57b and the center of the light-receiving surface of the light-receiving portion 12a of the light-receiving element 12, and the core 57 and the extension 57B are formed so as to be equal in size. More specifically, the light reflecting surface 57b formed by laser machining in the opto-electric hybrid board according to the second conventional art has stepped portions G formed in interface portions with a first cladding layer 56 and a second cladding layer 58. The reason is as follows. When the light reflecting surface 57b is formed by laser machining, the path of laser light is changed because the material (the refractive index) is changed in the interface portions. The reflection of the light L is not proper in an upper one of the stepped portions G (in the interface portion with the first cladding layer 56) of the light reflecting surface 57b, so that the reflected light L is not guided to the extension 57B. For this reason, the stepped portions G positioned in the core 57 become a cause of the increase in propagation losses of the light L. It should be noted that hatching is not used in FIG. 11A for the purpose of clearly showing the path of the light L and the light reflecting surface 57b, although FIG. 11A is a sectional view.

Figure 11B:
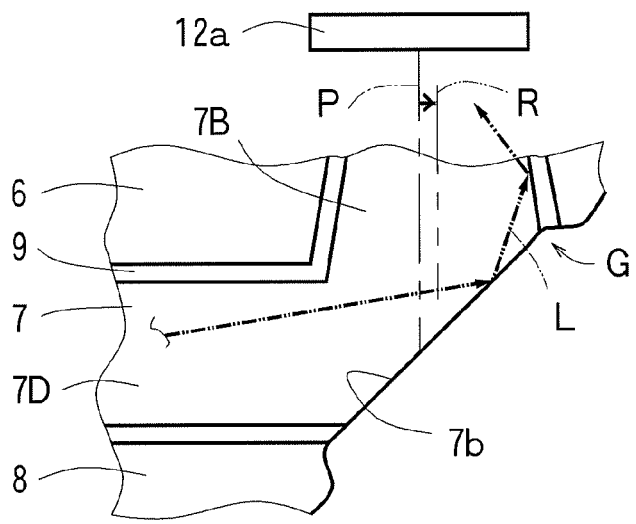
FIG. 11B is a schematic enlarged sectional view of a laser-machined light reflecting surface in the optical waveguide of the fifth embodiment according to the present disclosure.

In the fifth embodiment, the thickness (a horizontal dimension as seen in FIG. 11B) of the extension 7B of the core 7 is increased, and a central axis R of the extension 7B is displaced from the line P connecting the center of the light reflecting surface 7b and the center of the light-receiving surface of the light-receiving portion 12a of the light-receiving element 12 toward a first end (rightwardly as seen in FIGS. 10 and 11B) of the opto-electric hybrid board B5, as shown in FIG. 11B which is an enlarged view of principal parts. Thus, the upper end portion of the light reflecting surface 7b is positioned in the area of the extension 7B of the core 7, as mentioned above. When such a light reflecting surface 57b is formed by laser machining, the stepped portion G is formed in the upper end portion (the interface portion with the first cladding layer 6) of the light reflecting surface 7b. However, this stepped portion G is positioned in the extension 7B of the core 7 which exerts little influence on the reflection of the light L, and is not positioned in the main portion 7D of the core 7 which exerts influence on the reflection of the light L. That is, the fifth embodiment is capable of efficiently guiding the light L reflected from the light reflecting surface 7b to the front end surface of the extension 7B to further reduce the propagation losses of the light L. It should be noted that hatching is not used in FIG. 11B for the purpose of clearly showing the path of the light L and the light reflecting surface 7b, although FIG. 11B is a sectional view.

The fifth embodiment also produces functions and effects similar to those of the fourth embodiment in addition to the aforementioned functions and effects.

In the fifth embodiment shown in FIG. 10, the interface portions of the extension 7B and the main portion 7D of the core 7 with the first cladding layer 6 and the second cladding layer 8 are in the form of the mixed layers 9. However, an opto-electric hybrid board (not shown) which does not include the mixed layers 9 may be provided according to an additional embodiment. In the fifth embodiment shown in FIG. 10, the extension 7B of the core 7 is in the shape of a truncated quadrangular pyramid which is tapered gradually in a 5 direction in which the extension 7B extends (toward the front end surface). However, as shown in FIGS. 1, 5, and 7, an opto-electric hybrid board (not shown) in which the extension 7B of the core 7 is in the shape of a quadrangular prism having a constant dimension in the direction in which the extension 7B extends (on the front end surface side) may be provided according to an additional embodiment.

In the aforementioned embodiments, the dimension of the extension 7A on the light-emitting element 11 side is greater than that of the extension 7B on the light-receiving element 12 side. However, if the propagation losses of the light L are further reduced by the structure or the like of the opto-electric hybrid boards, the dimension of the extension 7A on the light-emitting element 11 side may be equal to or smaller than that of the extension 7B on the light-receiving element 12 side.

In the aforementioned embodiments, the area of the front end surface (the light entrance surface) of the extension 7A on the light-emitting element 11 side is greater than that of the light-emitting surface of the light-emitting portion 11a of the light-emitting element 11. However, if the propagation losses of the light L are further reduced by the structure or the like of the opto-electric hybrid boards, the area of the front end surface (the light entrance surface) of the extension 7A on the light-emitting element 11 side may be equal to or smaller than that of the light-emitting surface of the light-emitting portion 11a of the light-emitting element 11.

In the aforementioned embodiments, the area of the front end surface (the light exit surface) of the extension 7B on the light-receiving element 12 side is smaller than that of the light-receiving surface of the light-receiving portion 12a of the light-receiving element 12. However, if the propagation losses of the light L are further reduced by the structure or the like of the opto-electric hybrid boards, the area of the front end surface (the light exit surface) of the extension 7B on the light-receiving element 12 side may be equal to or greater than that of the light-receiving surface of the light-receiving portion 12a of the light-receiving element 12.

The extensions 7A and 7B of the core 7 are formed in the shape of quadrangular prisms in the first, second, and third embodiments (with reference to FIGS. 1, 5, and 7), and are formed in the shape of truncated quadrangular pyramids in the fourth and fifth embodiments (with reference to FIGS. 8 and 10). However, if the propagation losses of the light L are further reduced by the structure or the like of the opto-electric hybrid boards, the extensions 7A and 7B of the core 7 may be in other shapes, e.g. in the shape of circular cylinders or truncated cones. Further, the shape of the extension 7A on the light-emitting element 11 side and the shape of the extension 7B on the light-receiving element 12 side may be different from each other.

In the aforementioned embodiments, the front end surfaces of the extensions 7A and 7B of the core 7 are in abutment with the second surface (the lower surface as seen in the figures) of the insulative layer 1. However, a gap may be provided between the front end surfaces of the extensions 7A and 7B and the second surface of the insulative layer 1. Also, a through hole for an optical path may be formed in part of the insulative layer 1 which corresponds to each of the extensions 7A and 7B. In this case, the insulative layer 1 may be permeable or impermeable to light.

In the step of forming the first cladding layer 6 in the aforementioned embodiments, the through hole 6a for the formation of each of the extensions 7A and 7B of the core 7 is formed by the photolithographic process. However, other processes may be used to form the through hole 6a. An example of other processes may include: forming the first cladding layer 6 while the through hole 6a is not formed; and then forming the through hole 6a by laser machining.

The opto-electric hybrid boards A1 to A4 and B1 to B5 for connection to the opposite end portions of the optical fiber F are provided in the aforementioned embodiments. However, opto-electric hybrid boards without the optical fiber F therebetween may be used. Specifically, an opto-electric hybrid board may be configured such that both a light-emitting element and a light-receiving element are mounted on a single electric circuit board and such that light reflecting surfaces are formed in opposite end portions of a core of an optical waveguide stacked on the electric circuit board.

Next, examples of the present disclosure will be described in conjunction with comparative examples. It should be noted that the present disclosure is not limited to the examples.

EXAMPLES

[Material for Formation of First Cladding Layer and Second Cladding Layer]

Component a: 60 parts by weight of an epoxy resin (jER1001 available from Mitsubishi Chemical Corporation).

Component b: 30 parts by weight of an epoxy resin (EHPE3150 available from Daicel Corporation).

Component c: 10 parts by weight of an epoxy resin (EXA-4816 available from DIC Corporation).

Component d: 0.5 parts by weight of a photo-acid generator (CPI-101A available from San-Apro Ltd.).

Component e: 0.5 parts by weight of an antioxidant (Songnox1010 available from Kyodo Chemical Co., Ltd.).

Component f: 0.5 parts by weight of an antioxidant (HCA available from Sanko Co., Ltd.).

Component g: 50 parts by weight of ethyl lactate (a solvent).

A material for the formation of a first cladding layer and a second cladding layer was prepared by mixing these components a to g together.

[Material for Formation of Core]

Component h: 50 parts by weight of an epoxy resin (YDCN-700-3 available from Nippon Steel & Sumikin Chemical Co., Ltd.).

Component i: 30 parts by weight of an epoxy resin (jER1002 available from Mitsubishi Chemical Corporation).

Component j: 20 parts by weight of an epoxy resin (OGSOL PG-100 available from Osaka Gas Chemicals Co., Ltd.).

Component k: 0.5 parts by weight of a photo-acid generator (CPI-101A available from San-Apro Ltd.).

Component l: 0.5 parts by weight of an antioxidant (Songnox1010 available from Kyodo Chemical Co., Ltd.).

Component m: 0.125 parts by weight of an antioxidant (HCA available from Sanko Co., Ltd.).

Component n: 50 parts by weight of ethyl lactate (a solvent).

A material for the formation of a core was prepared by mixing these components h to n together.

Example 1

Using the aforementioned materials, opto-electric hybrid boards with optical elements not yet mounted therein were produced. The opto-electric hybrid boards had a structure in which side peripheral surfaces of extensions of the core were in contact with air (hollow portions). Then, one of the opto-electric hybrid boards on a light-emitting element side and the other opto-electric hybrid board on a light-receiving element side were connected to each other through an optical fiber having a length of 100 cm (FFP-GI20-0500 available from Miki Inc.) so as to be capable of light propagation (with reference to FIG. 1). The extension on the light-emitting element side had a cross-section (30 μm thick by 30 μm wide) slightly smaller than that (32 μm thick by 32 μm wide) of the extension on the light-receiving element side. The extensions had a length of 150 μm. The core had a main portion with the following dimensions: 50 μm thick by 50 μm wide, and 10 cm long. A stainless steel layer (a metal layer) had a thickness of 20 μm. An electric circuit board included an insulative layer having a thickness of 20 μm. The first cladding layer had a thickness [a thickness as measured from the back surface (the lower surface as seen in FIG. 1) of the metal layer] of 20 μm. The second cladding layer had a thickness [a thickness as measured from the top surface (the lower surface as seen in FIG. 1) of the core] of 30 μm.

Example 2

The extension on the light-emitting element side had a cross-section (40 μm thick by 40 μm wide) greater than that (25 μm thick by 25 μm wide) of the extension on the light-receiving element side (with reference to FIG. 1) in Example 1. The remaining parts were the same as those in Example 1.

Example 3

The opto-electric hybrid boards in Example 2 were structured such that the side peripheral surfaces of the extensions of the core were in contact with the first cladding layer. The remaining parts were the same as those in Example 2.

Examples 4 to 6

The opto-electric hybrid boards in Example 3 were structured such that interface portions of the extensions and the main portion of the core with the first cladding layer and the second cladding layer were in the form of mixed layers (with reference to FIG. 7). The percentage of the mixed layers with respect to the width or thickness of the extensions and the main portion of the core was as shown in TABLE 1 below. The remaining parts were the same as those in Example 3. The aforementioned percentage of the mixed layers was calculated using a measuring microscope (BF-3017D available from Mitutoyo Corporation) as the percentage thereof at cross-sections obtained by cutting the extensions and the main portion of the core.

Examples 7 to 9

The opto-electric hybrid boards in Example 6 were structured such that the extensions of the core were tapered gradually toward front end surfaces of the extensions (with reference to FIG. 8). The dimensions of the front end surfaces of the extensions and the inclination angle (the inclination angle with respect to an axial direction of the extensions) of the side peripheral surfaces thereof were as shown in TABLE 1 below. The inclination angle was measured using a laser microscope (VK-X250 available from Keyence Corporation). The remaining parts were the same as those in Example 6.

Examples 10 and 11

The opto-electric hybrid board on the side where the light-receiving element was mounted in Example 9 was configured such that the thickness of the extension of the core was increased and such that a central axis of the extension was displaced (offset) from a line connecting the center of a light reflecting surface and the center of a light-receiving surface of the light-receiving portion of the light-receiving element toward a first end (rightwardly as seen in FIGS. 10 and 11B) of the opto-electric hybrid board. This provided the structure in which an upper end portion of the light reflecting surface was positioned in the area of the extension of the core (with reference to FIGS. 10 and 11B). The amount of offset (μm) was as shown in TABLE 1 below. The aforementioned amount of offset was measured using the aforementioned laser microscope. The remaining parts were the same as those in Example 9.

Comparative Example 1

The opto-electric hybrid boards in Example 3 were structured such that the extensions of the core were not formed, and such that portions corresponding to the extensions in Example 3 were filled with the first cladding layer (first conventional art). The remaining parts were the same as those in Example 3.

Comparative Example 2

The dimensions (50 μm thick by 50 μm wide) of the extensions of the core were made equal to the dimensions (50 μm thick by 50 μm wide) of the main portion of the core from which the extensions extended in Example 3 (second conventional art)—The remaining parts were the same as those in Example 3.

[Measurement of Light Propagation Losses]

A light-emitting element (ULM850-10-TT-C0104U available from ULM Photonics GmbH) and a light-receiving element (PDCA04-70-GS available from Albis Optoelectronics AG) were prepared. The amount of light (M) was measured when light emitted from the light-emitting element was directly received by the light-receiving element. Then, the light-emitting element and the light-receiving element were mounted in the opto-electric hybrid boards of Examples 1 to 11 and Comparative Examples 1 and 2. In that state, the amount of light (N) was measured when light emitted from the light-emitting element was received by the light-receiving element. Based on the measured amounts of light, a light propagation loss (α) was calculated in accordance with Equation (1) below, and was listed in TABLE 1 below.

[MATH. 1]

$$\alpha = -10 \log_{10}(N/M) \quad (1)$$

An opto-electric hybrid board configured such that both the light-emitting element and the light-receiving element were mounted on a single electric circuit board and such that light reflecting surfaces were formed in opposite end portions of the core of the optical waveguide stacked on the electric circuit board without using the optical fiber also attained results having tendencies similar to those in Examples 1 to 11.

In Examples 1 to 11, the main portion of the core had the following dimensions: 50 µm thick by 50 µm wide. However, when the cross-sectional shape of the main portion was a square or rectangular shape varied in thickness and width in the range of 20 to 100 µm, results having tendencies similar to those in Examples 1 to 11 were attained.

Although specific forms in the present disclosure have been described in the aforementioned examples, the aforementioned examples should be considered as merely illustrative and not restrictive. It is contemplated that various

TABLE 1

| | | Examples | | | | | | | | | | | Comparative examples | |
|---|---|---|---|---|---|---|---|---|---|---|---|---|---|---|
| | | 1 | 2 | 3 | 4 | 5 | 6 | 7 | 8 | 9 | 10 | 11 | 1 | 2 |
| Dimension of core | Main portion | | | | | | | 50 | | | | | | |
| | Extensions Light-emitting element side | 30 | | | 40 | | | 40 | | | 40 | | — | 50 |
| | Light-receiving element side | 32 | | | 25 | | | 20 | | | 10 | | — | 50 |
| Percentage of mixed layers (%) | | | 0 | 5 | 10 | | | 20 | | | | | 0 | |
| Inclination angle (°) | | | | 0 | | | | 16.7 | 19.3 | 21.8 | 24.2 | 26.6 | 0 | |
| Amount of offset (µm) | | | | | 0 | | | | | | 2.5 | 5.0 | 0 | |
| Light propagation loss: α | | 4.08 | 3.91 | 3.41 | 3.16 | 2.99 | 2.77 | 2.59 | 2.34 | 2.11 | 2.04 | 1.94 | 6.25 | 5.12 |

The dimension of the core is the length (µm) of one side of the cross-section (square) thereof.
The dimension of the extensions in Examples 7 to 11 is the dimension of a base end portion (a boundary with the main portion).

The results in TABLE 1 show that the light propagation losses are lower in Examples 1 to 11 than in Comparative Examples 1 and 2. In Examples 1 to 11, it is found that the light propagation losses are lower, in particular, in Examples 2 to 11 in which the dimension of the extension on the light-emitting element side is greater than that of the extension on the light-receiving element side. It is also found that the light propagation losses are much lower, among others, in Examples 4 to 11 in which the mixed layers are formed in the extensions and the main portion of the core, that the light propagation losses are considerably lower in Examples 7 to 11 in which the extensions of the core are tapered gradually toward the front end surfaces of the extensions, and that the light propagation losses are especially lower in Examples 10 and 11 in which the upper end portion of the light reflecting surface is positioned in the area of the extension of the core.

Opto-electric hybrid boards in which the mixed layers were not formed in the extensions and the main portion of the core in Examples 7 to 11 also attained results having tendencies similar to those in Examples 7 to 11. Further, opto-electric hybrid boards in which the extension of the core was formed to have a constant dimension toward the front end surface of the extension in Examples 10 and 11 also attained results having tendencies similar to those in Examples 10 and 11.

modifications evident to those skilled in the art could be made without departing from the scope of the present disclosure.

The opto-electric hybrid board according to the present disclosure is applicable to further reducing the propagation losses of light.

REFERENCE SIGNS LIST

A1 Opto-electric hybrid board
B1 Opto-electric hybrid board
E Electric circuit board
L Light
W Optical waveguide
7 Core
7A Extension
7B Extension
7D Main portion
7a Light reflecting surface
7b Light reflecting surface
11 Light-emitting element
12 Light-receiving element

The invention claimed is:

1. An opto-electric hybrid board comprising:
an electric circuit board;
an optical element mounted on a first surface of the electric circuit board; and
an optical waveguide having a core for an optical path and formed in a stacked manner on a second surface on the opposite side of the electric circuit board from the first surface,
wherein the electric circuit board includes an insulative layer permeable to light, and an electrical interconnect line formed on a first surface of the insulative layer,
wherein the insulative layer has a second surface on the side opposite from the first surface thereof, and the second surface of the insulative layer is the second surface of the electric circuit board on which the optical waveguide is formed in a stacked manner,
wherein the core of the optical waveguide includes an end portion formed as a light reflecting surface for reflecting light to allow the light to propagate between the core and the optical element, an extension extending from the end portion side of the core toward the optical element, and a main portion from which the extension extends,
wherein the extension of the core and the main portion of the core are different from each other in shape of cross-sections perpendicular to an axial direction thereof, and
wherein the extension of the core has a front end surface in abutment with the second surface of the insulative layer.

2. The opto-electric hybrid board according to claim 1, wherein the optical element is a light-emitting element including a light-emitting portion having a light-emitting surface, and wherein the front end surface of the extension of the core has an area greater than that of the light-emitting surface of the light-emitting portion of the light-emitting element.

3. The opto-electric hybrid board according to claim 1, wherein the optical element is a light-receiving element including a light-receiving portion having a light-receiving surface, and wherein the front end surface of the extension of the core has an area smaller than that of the light-receiving surface of the light-receiving portion of the light-receiving element.

4. The opto-electric hybrid board according to claim 1, wherein the extension of the core has a side peripheral surface in contact with a cladding layer of the optical waveguide, and wherein an interface portion of the extension of the core with the cladding layer is a mixed layer in which a material for the formation of the cladding layer is mixed with a material for the formation of the core.

5. The opto-electric hybrid board according to claim 1, wherein the extension of the core is tapered gradually toward the front end surface of the extension.

6. The opto-electric hybrid board according to claim 1, wherein an end portion of the light reflecting surface on the optical element side is positioned in an area of the extension of the core.

* * * * *